United States Patent [19]

Hoenig

[11] Patent Number: 4,700,135
[45] Date of Patent: Oct. 13, 1987

[54] APPARATUS FOR MEASURING WEAK MAGNETIC FIELDS HAVING SEVERAL GRADIOMETERS WITH ASSOCIATED SQUID ARRAY

[75] Inventor: Eckhardt Hoenig, Erlangen, Fed. Rep. of Germany

[73] Assignee: Siemens Aktiengesellschaft, Munich, Fed. Rep. of Germany

[21] Appl. No.: 854,774

[22] Filed: Apr. 22, 1986

[30] Foreign Application Priority Data

Apr. 26, 1985 [DE] Fed. Rep. of Germany ....... 3515199

[51] Int. Cl.$^4$ .................. G01R 33/022; G01R 33/035
[52] U.S. Cl. .................................... 324/248; 324/260; 336/DIG. 1
[58] Field of Search .................. 324/248, 244, 260; 29/599; 336/DIG. 1; 335/216; 361/381, 382

[56] References Cited

U.S. PATENT DOCUMENTS

| | | | |
|---|---|---|---|
| 3,962,628 | 6/1976 | Rein | 324/248 |
| 3,965,411 | 6/1976 | Hesterman | 324/248 X |
| 4,349,781 | 9/1982 | Vozoff | 324/248 X |

FOREIGN PATENT DOCUMENTS 0111827 12/1983 European Pat. Off. .

OTHER PUBLICATIONS

IEEE Trans Mag., vol. MAG-11, No. 2, 3/2/75, pp. 778–781.
Cryogenics, vol. 23, (1983) No. 5, pp. 263–264.
Physica 107B (1981) pp. 29, 30.
Rev. Sci. Instrum. 53 (12) Dec. 1982, pp. 1815–1845.

Primary Examiner—Gerard R. Strecker
Attorney, Agent, or Firm—Kenyon & Kenyon

[57] ABSTRACT

The gradiometers are arranged with their associated SQUIDs in a double-wall Dewar vessel which is equipped with a narrow neck. A gradiometer array is provided with a multiplicity of individually mountable gradiometers, the detector coils of which are arranged side-by-side. The radiometers are connected via a superconducting plug connection to a SQUID array of DC-SQUIDs which is designed with a measuring head and a multiple connector as a plug-in module. The multiple connector can be inserted with the SQUID array through the neck of the Dewar vessel and can be plugged into a mating plug-in device which is associated with the gradiometer array and is fastened by a mounting device to the bottom of the Dewar vessel. In this embodiment of the apparatus, for instance, a plane gradiometer array for magnetocardiography can be exchanged for a curved gradiometer array for magnetoencephalography.

3 Claims, 2 Drawing Figures

APPARATUS FOR MEASURING WEAK MAGNETIC FIELDS HAVING SEVERAL GRADIOMETERS WITH ASSOCIATED SQUID ARRAY

BACKGROUND OF THE INVENTION

The present invention relates to apparatus for measuring weak magnetic fields with several gradiometers which are arranged, with their associated SQUIDs, in a Dewar vessel which is provided with a relatively narrow neck.

It is known to use superconducting quantum interference devices which are known by the designation "SQUID" (Superconducting Quantum Interference Device) for measuring weak variable magnetic fields, for instance, in a field intensity range below $10^{-10}$T and in particular, below $10^{-12}$T. These elements are preferably used in medical technology, especially in magnetocardiography, where magnetic fields of the heart in the order of about 50 pT are measured as well as in magnetoencephalography, where magnetic fields of the brain in the order of about 0.1 pT must be measured. The apparatus essentially comprises a detector coil which, together with a coupling coil, forms a flux transformer. Associated with the SQUID is electronic circuitry for determining and processing signals. Since the magnetic fields to be measured are up to six orders of magnitude smaller than the external interference fields, appropriate shielding is necessary. Because of its greater sensitivity, a DC-SQUID (direct current SQUID) can be used which contains two Josephson junctions. With an associated compension coil, the detector coil forms a so-called gradiometer. With gradiometers of the zero$^{th}$, first or higher order, the biomagnetic near field which is still non-uniform in the gradiometer range can be determined selectively.

In order to obtain a three-dimensional field distribution, measurements must be made at successive points in time of the region to be examined. However, the difficulty then arises that the coherence of the field data is no longer assured over the required measuring time and in addition, clinically intolerable measuring times result. While with one known device which contains several parallel measuring channels each with an RF SQUID (Radio Frequency SQUID), the measuring time can be shortened in principle (Physica 107B (1981), pages 29 and 30, North Holland Publishing Co.), a gradiometer array, with which at least one SQUID array is associated, cannot be made with this embodiment.

The SQUIDs and their superconducting components are kept during operation at a temperature of 4.2 K and are immersed for this purpose in liquid helium. The space between the double walls of the Dewar vessel is evacuated and contains exhaust-gas-cooled superinsulation. The heat supply from the outside through the walls of the vessel is therefore small. In order to achieve a long service life of, for instance, several weeks, however, the heat supply through the neck of the Dewar vessel must be limited. Therefore, these Dewar vessels are provided with a relatively narrow neck with integrated exhaust-cooling (Rev. Sci. Instrum. 53 (12) December 1982, pages 1815 to 1845).

The field distribution over a larger area, for instance, in magnetocardiograpy can be determined with a gradiometer array which contains a multiplicity of gradiometers, for instance, 50 or more, which, for instance, form a matrix, and the detector coils of which are arranged side-by side in a plane. Such a gradiometer, however, can no longer be inserted through the narrow neck in the Dewar vessel.

SUMMARY OF THE INVENTION

It is therefore an object of the present invention to provide apparatus for measuring weak magnetic fields, in which a multiplicity of gradiometers is associated with a corresponding multiplicity of SQUIDs and which nevertheless makes possible a long service interval of the Dewar vessel.

The above and other objects of the invention are achieved by an apparatus for measuring weak magnetic fields having a plurality of gradiometer means arranged with their associated SQUID means in Dewar vessel means provided with a relatively narrow neck, the gradiometer means being provided in a gradiometer array means comprising a plurality of said gradiometer means which can be mounted individually at the bottom of the Dewar vessel means, the gradiometer means comprising detector coil means arranged in adjacent relationship and being connected via a superconducting plug connection means to SQUID array means comprising DC-SQUID means to which a measuring head means is coupled, the SQUID array means, the measuring head means and a multiple connector means of the plug connection means comprising a plug-in unit, the multiple connector means being insertable with the SQUID array means through the neck of the Dewar vessel means and being pluggable into a mating plug connection means assigned to the gradiometer means, the mating plug connection means being fastened by holder means to the bottom of the Dewar vessel means.

The invention is based on the insight that a widening of the neck of the Dewar vessel is not necessary if the gradiometer coils of the gradiometer array can be inserted individually at the bottom of the Dewar vessel. The individual gradiometers with relatively small dimensions are inserted individually and successively at the bottom of the Dewar vessel into appropriate holders. Thereby, a gradiometer array of nearly any desired extent is created. The connecting lines of the gradiometers which are flexible at room temperature are connected to the mating connectors assigned to them which are likewise supported on the bottom of the Dewar vessel. With the design of the SQUID array and its superconducting connections as a plug-in module, the SQUID array with the associated multi-contact connector can be introduced through the neck of the Dewar vessel and plugged into the mating connector acting as a "jack". It is a particular advantage of this design that gradiometers can be interchanged for different purposes. For instance, a plane gradiometer array for magnetocardiography can be exchanged for a curved gradiometer array which is provided for magnetoencephalography.

In a particular simple embodiment of the apparatus, the plug connector can comprise concentric contact rings which are provided with superconducting spring contacts, to which the superconductors are connected. The spring contacts need only be hung into the associated contact ring, for instance, in corresponding slots.

The SQUID array can preferably comprise DC-SQUIDs in thin-film technology, of which a large number are arranged on a substrate having a flat side of relatively small dimensions and which can be introduced with its multiple plug through the narrow Dewar neck without difficulties.

BRIEF DESCRIPTION OF THE DRAWINGS

The invention will be explained in greater detail in the following detailed description with reference to the drawings, in which.

DETAILED DESCRIPTION

Figure 1:
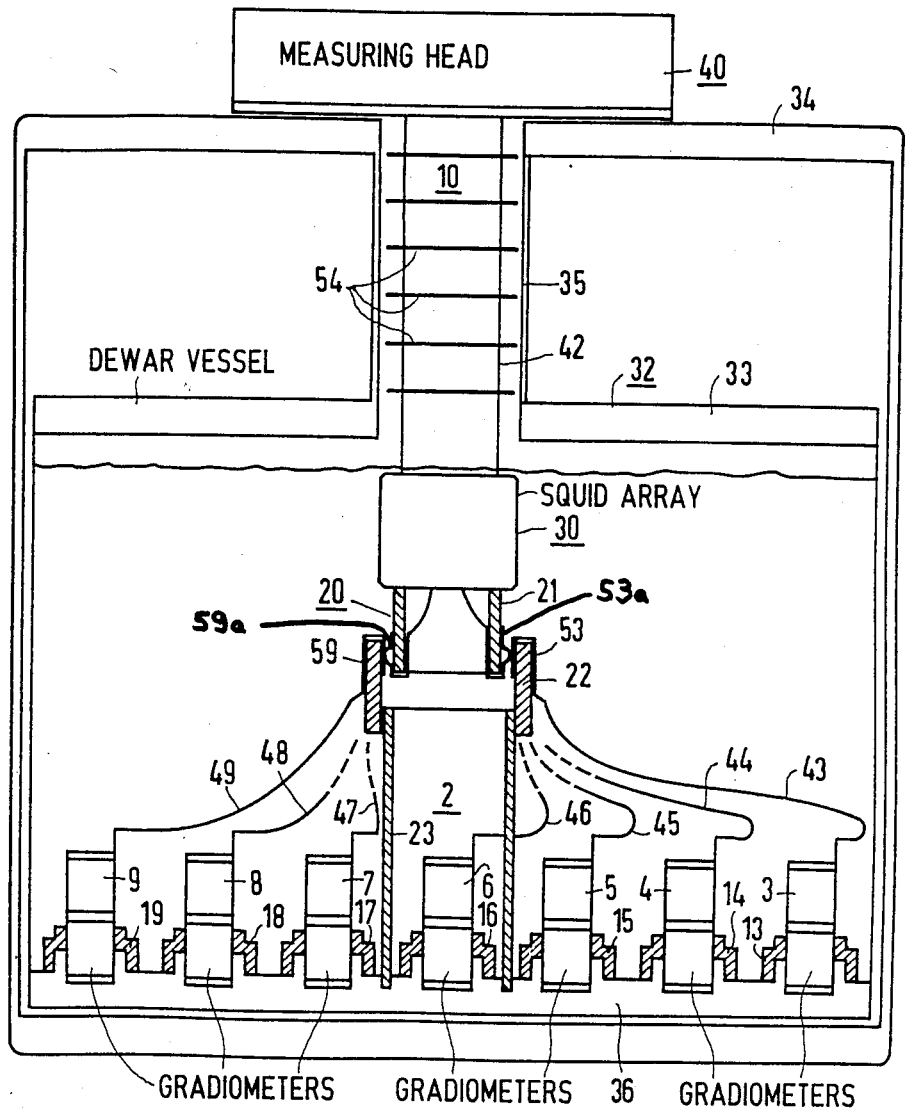
FIGS. 1 and 2 schematically show two embodiments of apparatus according to the invention.

With reference now to the drwaings, in the embodiment of apparatus for measuring weak magnetic fields according to FIG. 1, a gradiometer array 2 is provided which contains a multiplicity of gradiometers, for instance, at least 30 gradiometers, of which ony seven are shown in the figure for the sake of simplification and are designated with 3 to 9. They may be, for instance, second-order gradiometers, of which the detector coils, not specifically designated, are arranged in a manner known per se with their associated compensation coils in three planes on top of each other. These gradiometers 3 to 9 can each be mounted in separate holders which are designated in the figure with 13 to 19. These holders substantially comprise a profile ring of dimensionally stable plastic, particularly tetrafluoroethylene (Teflon) which forms a loose mounting at room temperature and contracts at the cryo temperature in such a manner that it forms a mechanically strong mounting for the associated gradiometer. The gradiometers 3 to 9 are inserted with their lower ends, which contain the detector coil, into a corresponding recess of the body 36, not specifically designated in the figure, of a double-walled Dewar vessel 32 which is provided with a relatively narrow neck 35.

The space between the vessel walls 33 and 34 is evacuated in the manner known per se and contains superinsulation not shown in the figure.

Between the gradiometer array 2 and the SQUID array 30, a detachable line connection is provided which is designed as a plug connection 20. The squid array 30 with a measuring head 40 and a multiple-contact plug 21 forms a plug-in module 10. The SQUID array 30 comprises DC-SQUIDs which are associated with the measuring head 40 which contains the necessary electronic circuitry.

The DC-SQUIDs of the SQUID array 30 can be fabricated with their two Josephson junctions and their coupling coils as well as their modulation coils preferably as a structural unit by a thin-film technology and can be arranged on a common semiconductor substrate which preferably comprises silicon. In this design of the structural units as separate planar thin-film structures, their electrically conducting parts are separated by electrically insulating spacers. For the individual DC-SQUIDs, magnetic decoupling can additionally be provided, which may comprise a superconducting ring.

Between the SQUID array 30 which is connected to the measuring head 40 via a mechanically strong holder 42 to the measuring head 40 and the gradiometer array 2, the plug connection 20 is arranged. The multiple plug 21 of connection 20 and the mating plug connector 22 can preferably comprise concentric contact rings, of which one is fastened to the SQUID array 30 and the other, via a mechanically strong holder 23, is fastened to the bottom 36 of the Dewar vessel 32.

The electric leads for the gradiometers 3 to 9 are designated in the figure with 43 to 49. The leads from the gradiometers 3 to 9 are not shown in the figure for simplification. At the mating connector 22, a flat superconducting spring element is provided for the connecting conductors 43 to 49, of which only two are schematically indicated in the figure as a cross section and are designated with 53 and 59, respectively, and which, in the practical embodiment of the plug connection 20 can be inserted for instance, into the corresponding slot of the contact ring. Contact ring 21 coupled to the SQUID array 30 also includes corresponding spring elements 53a and 59a for mating with elements 53 and 59. These spring elements 53 and 59 and 53a and 59a can comprise, for instance, niobium, or can be coated with niobium. As connecting conductors 43 to 49, niobium wires, for instance, are suitable which are provided with insulating tubing which is flexible at room temperature and rigid at the helium temperature. The niobium spring element and wire can be connected by spot welding.

In a particularly advantageous embodiment, the connecting leads can be designed as foil conductors and comprise a superconducting alloy, preferably lead/tin which is arranged on a carrier which is connected to the plastic foil. Manganin or also bronze, for instance, can be provided as the carrier. This lead/tin alloy can be designed with its carrier as a micro structure with a thickness of a few $\mu m$, for instance, 10 $\mu m$ and can be connected to the spring elements 53 and 59 by a solder joint. The connecting conductors of the SQUID array 30 with the measuring head 40 are not shown in the figure for simplification. The neck 35 of the Dewar vessel 32 contains in a manner known per se a fairly large number of radiation shields 54. This design of the apparatus for measuring weak magnetic fields with detector coils of the gradiometers 3 to 9 arranged side-by-side in a plane can preferably be used in magnetocardiography.

Figure 2:
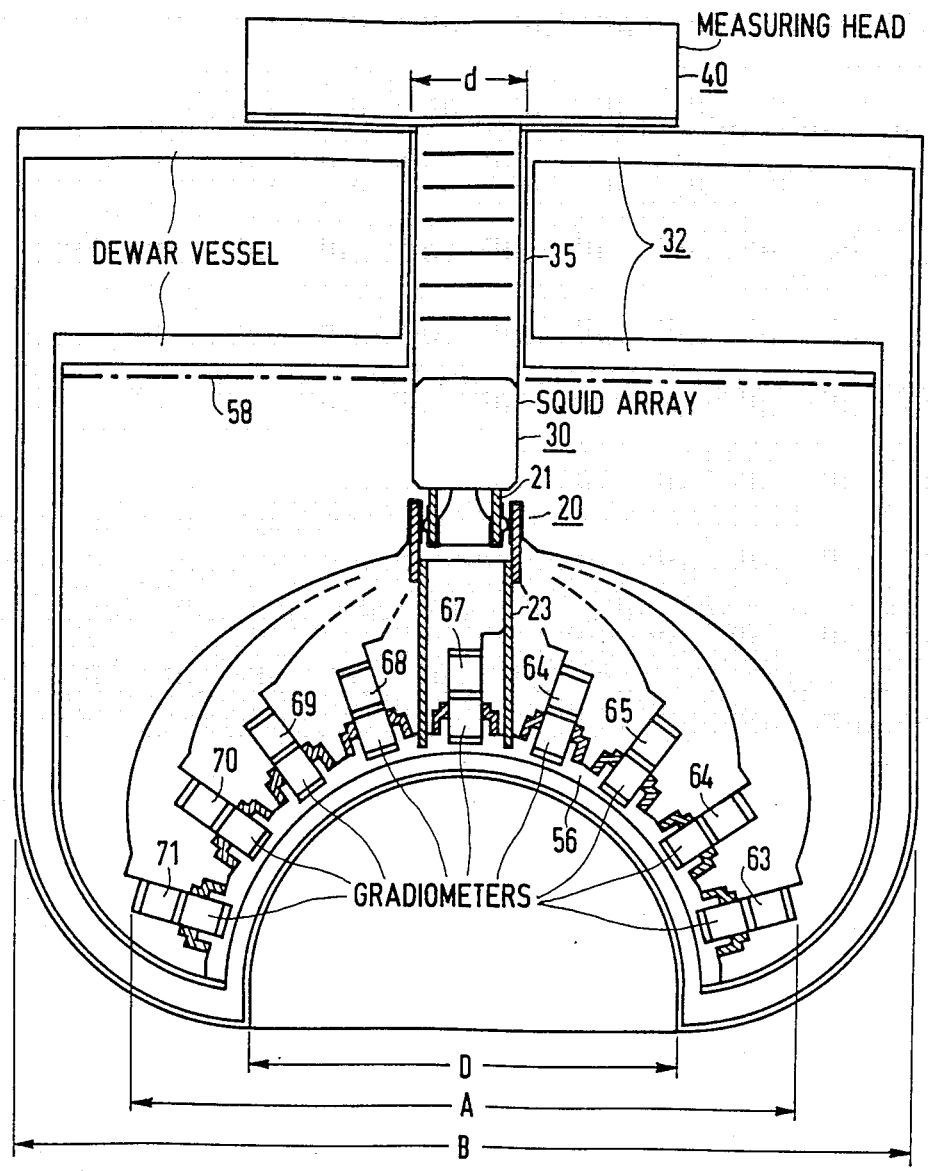

In the embodiment of apparatus for measuring weak magnetic fields according to FIG. 2, gradiometers 63 to 71 are arranged side-by-side in such a manner that their detector coils, not shown in the figure, are arranged on a curved surface which, for instance, approximately forms a spherical sector, the diameter D of which can be, for instance, about 20 cm. The entire extent A of the gradiometer array can be at least 30 cm and the outside diameter B of the Dewar vessel 32 about 30 to 40 cm. On the other hand, the diameter d of the neck 35 of the Dewar vessel 32 is substantially smaller and in general will not substantially exceed about 10 cm. The SQUID array 30 is designed as a plug-in module with the multiple connector of the plug connection 20 and the measuring head 40 and is inserted through the narrow neck of the Dewar vessel 32. The holder 23 for the mating connector of the plug-in connection 20 is fastened to the curved body 56 of the Dewar vessel 32. Heat removal from the liquid helium, the level of which is designated with 58 in the figure, through the neck 35 of the Dewar vessel 32 is therefore small, and the service life of the apparatus is correspondingly long. With this embodiment of the apparatus, the entire field distribution of a measurement object having a curved surface, for instance, at the head of a person, can be measured in a joint operation.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly to be regarded in an illustrative rather than a restrictive sense.

What is claimed is:

1. Apparatus for measuring weak magnetic fields having a plurality of gradiometer means arranged together with SQUID means associated with said plurality of gradiometer means in a Dewar vessel means provided with a relatively narrow neck, the plurality of gradiometer means constituting a gradiometer array means, each of said gradiometer means being mounted individually at the bottom of the Dewar vessel means, the gradiometer means each comprising detector coil means and being arranged in adjacent relationship at said bottom and being connected via superconducting plug connection means to said SQUID means, said SQUID means comprising a plurality of DC-SQUID means constituting a SQUID array means, a measuring head means being coupled to said SQUID array means, the SQUID array means, the measuring head means and a multiple connector means of the plug connection means comprising a plug-in unit, the multiple connector means being insertable with the SQUID array means through the neck of the Dewar vessel means, said multiple connector means being pluggable into a mating plug connection means of the plug connection means associated with and coupled to the plurality of gradiometer means, said mating plug connection means being fastened by holder means to the bottom of the Dewar vessel means.

2. The apparatus recited in claim 1, wherein the gradiometer means are arranged adjacently such that their detector coils are arranged to form a curved surface.

3. The apparatus recited in claim 1, wherein the multiple connector means and the mating plug connection means of the plug connection means comprise concentric contact rings, of which one is associated with and coupled to the gradiometer array means and the other to the SQUID array means.

* * * * *